United States Patent [19]
Futakuchi et al.

[11] Patent Number: 6,064,282
[45] Date of Patent: May 16, 2000

[54] PIEZOELECTRIC FILTER HAVING A CAPACITANCE ELECTRODE EXTENDING ONTO A SUBSTRATE SIDE SURFACE

[75] Inventors: Tomoaki Futakuchi, Takaoka; Kunio Sawai, Shinminato; Taketoshi Hino, Toyama, all of Japan

[73] Assignee: Murata Manufacturing Co., Ltd., Kyoto, Japan

[21] Appl. No.: 09/116,354

[22] Filed: Jul. 16, 1998

[30] Foreign Application Priority Data

Jul. 17, 1997 [JP] Japan .................................. 9-192782

[51] Int. Cl.[7] .................................................... H03H 9/56
[52] U.S. Cl. ........................... 333/192; 333/191; 310/340; 310/349; 310/366
[58] Field of Search .................................... 333/186–189, 333/190–192; 310/320, 321, 340, 345, 348, 353, 366, 349

[56] References Cited

U.S. PATENT DOCUMENTS

| | | | |
|---|---|---|---|
| 4,365,181 | 12/1982 | Yamamoto | 310/348 X |
| 5,084,647 | 1/1992 | Inoue et al. | 310/320 |
| 5,231,327 | 7/1993 | Ketcham | 310/320 X |
| 5,670,919 | 9/1997 | Gamo | 333/191 X |

FOREIGN PATENT DOCUMENTS

| | | | |
|---|---|---|---|
| 62-122406 | 6/1987 | Japan | 333/187 F |
| 5-83083 | 4/1993 | Japan | 333/191 |
| 6-268474 | 9/1994 | Japan | 333/191 |
| 7-263999 | 10/1995 | Japan . | |

*Primary Examiner*—Benny Lee
*Assistant Examiner*—Barbara Summons
*Attorney, Agent, or Firm*—Graham & James LLP

[57] ABSTRACT

A piezoelectric filter has a significantly reduced size and a sufficient coupling capacitance while avoiding an uneven outer configuration of an overall shape of the filter. The piezoelectric filter includes a first resonating unit and a second resonating unit and a coupling capacitance unit disposed in a piezoelectric substrate. The coupling capacitance unit is provided with a first coupling capacitance electrode located on an upper surface of the piezoelectric substrate and a second coupling capacitance electrode located on a lower surface thereof and the first and second coupling capacitance electrodes are arranged to extend to side edge surfaces of the piezoelectric substrate.

18 Claims, 5 Drawing Sheets

PIEZOELECTRIC FILTER HAVING A CAPACITANCE ELECTRODE EXTENDING ONTO A SUBSTRATE SIDE SURFACE

BACKGROUND OF THE INVENTION

1. Field of the Invention

The present invention relates to a piezoelectric filter including a piezoelectric substrate having first and second major surfaces opposed to each other and at least one side edge surface located between the first and second major surfaces, a plurality of resonating units each including a pair of resonance electrodes provided on the first major surface with a gap defined between the pair of resonance electrodes and a common electrode provided on the second major surface and opposed to the pair of resonance electrodes with the piezoelectric substrate disposed therebetween, and a coupling capacitance unit including a pair of coupling capacitance electrodes provided on the first and the second major surfaces, respectively and opposed to each other via the piezoelectric substrate. The piezoelectric filter can be used as a band-pass filter in a television receiver or a radio receiver or other similar device.

2. Description of Related Art

Recently, there has been great demand to decrease the size of electronic devices such as a television receiver, a radio receiver and the like. As a result, it has also been required that a size of band-pass filters incorporated in such devices also be significantly reduced in size while also requiring either maintaining the capacitance or even providing increased capacitance despite the decrease in overall size of the component.

In order to increase capacitance, a distance between electrodes can be decreased or an area of the electrodes on the major surfaces of a piezoelectric substrate can be increased. The distance between electrodes can be decreased by decreasing the thickness of the piezoelectric substrate but this changes the resonance frequency of the piezoelectric component to a different, undesired frequency. Thus, this method is not acceptable. If the area of the electrodes on the major surfaces of the piezoelectric substrate is increased, this increases the size of the filter which is also unacceptable. These problems will be described in more detail with reference to particular conventional structure in the following paragraphs.

An explanation will be given of the structure of a piezoelectric filter constructed for use in such electronic devices, with reference to FIG. 8. As shown in FIG. 8, a piezoelectric filter 51 includes a substantially rectangular piezoelectric ceramic plate 52 polarized in a thickness direction. A first resonating unit 53, a second resonating unit 54 and a coupling capacitance unit 55 are provided on the piezoelectric ceramic plate 52.

The first resonating unit 53 is provided with a pair of resonance electrodes 53a and 53b arranged to be opposite to each other with a gap defined therebetween on an upper surface of the piezoelectric ceramic plate 52 and a common electrode 53c arranged to oppose the pair of resonance electrodes 53a and 53b on the lower surface of the piezoelectric ceramic plate 52 with the piezoelectric ceramic plate 52 disposed between the resonance electrodes 53a and 53b and the common electrode 53c. The second resonating unit 54 is also provided with a pair of resonance electrodes 54a and 54b and a common electrode 54c which are arranged as described above with reference to the first resonating unit 53.

The coupling capacitance unit 55 is provided with a coupling capacitance electrode 55a located on the upper surface of the piezoelectric ceramic plate 52 and a coupling capacitance electrode 55b located on the lower surface.

In the piezoelectric filter 51, an input electrode 56a is disposed at a corner portion of the upper surface of the piezoelectric ceramic plate 52 and an output electrode 56b is disposed at the vicinity of the other corner portion of the upper surface of the piezoelectric ceramic plate 52. The input electrode 56a is connected to the resonance electrode 53a. Further, the output electrode 56b is connected to the resonance electrode 54b of the second resonating unit 54.

A lead-out electrode 56c which is connected to the ground potential is disposed on the lower surface of the piezoelectric ceramic plate 52. The lead-out electrode 56c is connected to the common electrodes 53c and 54c and the coupling capacitance electrode 55b. Further, the resonance electrode 53b and the resonance electrode 54a are electrically connected via a conductive connection portion 57 and the coupling capacitance electrode 54a is connected to the conductive connection portion 57.

In the piezoelectric filter 51, the coupling capacitance unit is constituted by forming the above-described coupling capacitance electrodes 55a and 55b. A desired filter characteristic cannot be provided unless the coupling capacitance unit is provided with a certain amount of capacitance. Accordingly, the coupling capacitance electrodes 55a and 55b must have large areas of at least a certain minimum size, which has prevented a reduction in size of the piezoelectric filter 51.

In one specific example of a related prior art device, Japanese Unexamined Utility Model JU-A-7-43006 discloses a piezoelectric filter which is illustrated in FIG. 9. According to the piezoelectric filter 61, a reduction in size is achieved by using an externally mounted multi-layer capacitor in order to provide a coupling capacitance. That is, the piezoelectric filter 61 is defined by bonding a multi-layer capacitor 65 on a piezoelectric ceramic plate 64 where a first resonating unit 62 and a second resonating 63 are disposed.

The first and the second resonating units 62 and 63 are arranged similarly to the first and the second resonating units 53 and 54 of the above-described piezoelectric filter 51. A resonance electrode 62b on one side of the first resonating unit 62 is connected to a coupling capacitance electrode 66 and a resonance electrode 63a on one side of the second resonating unit 63 is also connected to the coupling capacitance electrode 66. An external electrode 65a of the multi-layer capacitor 65 is connected to the coupling capacitance electrode 66. Another external electrode 65b of the multi-layer capacitor 65 is electrically connected to a coupling capacitance electrode provided on one surface of the piezoelectric ceramic plate 64 which is not illustrated.

That is, the piezoelectric filter 61 is arranged such that the multi-layer capacitor 65 is connected across the pair of coupling capacitance electrodes provided on the piezoelectric ceramic plate 64 in a parallel arrangement. According to this arrangement, the electrostatic capacitance of the multi-layer capacitor 65 is added and therefore, a larger coupling capacitance can be achieved without increasing the areas of the coupling capacitance electrodes.

However, according to the piezoelectric filter 61, the multi-layer capacitor 65 must be connected to the piezoelectric ceramic plate 64 and therefore, the manufacturing steps are complicated. In addition, the multi-layer capacitor 65 must be prepared as a separate component which is separate from the piezoelectric ceramic plate 64 and which is formed by arranging the first and second resonating units and the coupling capacitance unit as described above. Therefore, the manufacturing cost of the piezoelectric filter is increased.

Moreover, the outer shape of the piezoelectric filter described above is complicated since the multi-layer capacitor 65 is bonded to the piezoelectric ceramic plate 64 as shown in FIG. 8. As a result, when the piezoelectric filter 61 is arranged as described above and shown in FIG. 8, for example, an electronic component which is externally mounted on the substrate via resin, the overall shape of the total apparatus is uneven and therefore, cracks, defects and the like are liable to occur.

Further, even when the piezoelectric filter 61 is arranged such that an electronic component such as a chip capacitor is externally mounted via resin on the filter 61, the overall shape of the resulting apparatus is uneven. Therefore, when a taping process used for joining the electronic component to the piezoelectric filter 61 is performed, the piezoelectric filter may not be mounted reliably and securely in a recess portion of a taping and therefore, taping failure is liable to occur.

Thus, it has not been possible to achieve a decrease in filter or component size and an increase in component capacitance without either increasing the size of the electrodes, decreasing the thickness of the piezoelectric substrate which changes the resonance frequency of the component, and causing a component to have an uneven and unstable shape caused by a separate component being awkwardly mounted thereon.

SUMMARY OF THE INVENTION

In order to overcome the problems described above, the preferred embodiments of the present invention provide a piezoelectric filter which is arranged to achieve a significant reduction in size of an electronic component and to achieve great simplification of an overall shape of an electronic component while also achieving a significant increase in a coupling capacitance and avoiding the need for the component to have an outer configuration that creates an uneven outer profile or shape.

The preferred embodiments of the present invention also provide a piezoelectric filter which is characterized in that at least one of the coupling capacitance electrodes contained therein extends to a side edge surface of the piezoelectric substrate.

According to the above described structure of preferred embodiments of the present invention, a capacitance is defined by portions of the coupling capacitance electrode extending to the side edge surfaces of a piezoelectric substrate and another coupling capacitance electrode is added. Accordingly, the coupling capacitance is increased without increasing the areas of the coupling capacitance electrodes disposed opposite to each other with the piezoelectric substrate disposed therebetween. Therefore, a piezoelectric filter having a sufficient magnitude of a coupling capacitance is achieved despite having such a reduced overall size.

In addition, since an externally mounted multi-layer capacitor is not required, the outer shape of the piezoelectric filter is not uneven and the manufacturing steps are not complicated. That is, a piezoelectric filter having a small size and a large coupling capacitance can inexpensively be provided by using manufacturing steps which are simple to carry out.

In the above described piezoelectric filter, the resonating units may be arranged to vibrate in a thickness extensional vibration mode. Alternatively, the resonating units may be arranged to vibrate in another suitable vibration mode.

In the above described piezoelectric filter, the coupling capacitance electrode extending to the side edge surface of the piezoelectric substrate is preferably connected to a ground potential.

According to the above structure of preferred embodiments of the present invention, when seal substrates are laminated on the piezoelectric filter to define a chip type piezoelectric filter component, for example, the chip type component can easily be formed since an external electrode connected to the coupling capacitance electrode which is connected to the ground potential is located on the side edge surfaces of a laminated body.

According to one preferred embodiment of the present invention, a chip type piezoelectric filter includes the above described piezoelectric filter, a pair of seal substrates provided on the first and the second major surfaces of the piezoelectric filter, respectively, a space provided between the pair of resonance electrodes for preventing a vibration of the resonating unit from being hindered.

The preferred embodiments of the present invention further provide a piezoelectric filter component including the above described novel piezoelectric filter, a resin member covering the piezoelectric filter, a plurality of lead terminals electrically connected to the pair of resonance electrodes and the pair of coupling capacitance electrodes, respectively, and extending outwardly from the resin member, and a space provided between the pair of resonance electrodes for preventing a vibration of the resonating unit from being hindered.

Other features and advantages of the present invention will become apparent from the following description of preferred embodiments of the invention which refers to the accompanying drawings.

BRIEF DESCRIPTION OF THE DRAWINGS

FIG. 1(*b*) is a perspective view of a piezoelectric filter according to a preferred embodiment of the present invention which is viewed from a second major (lower) surface thereof.

DETAILED DESCRIPTION OF PREFERRED EMBODIMENTS

Figure 1A:
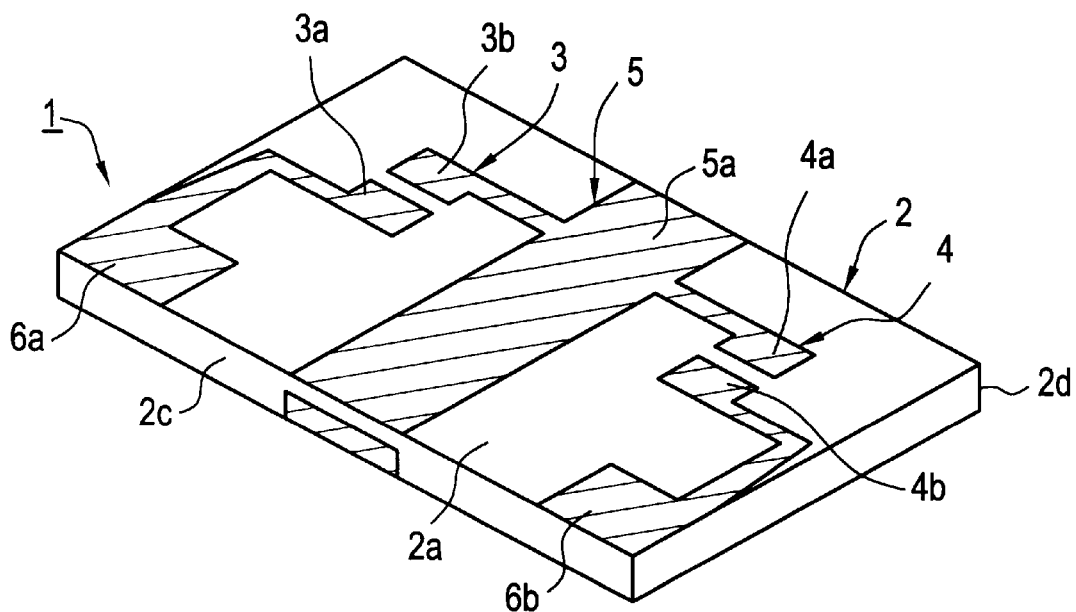
FIG. 1(*a*) is a perspective view of a piezoelectric filter according to a preferred embodiment of the present invention which is viewed from a first major (upper) surface thereof.
Figure 1B:
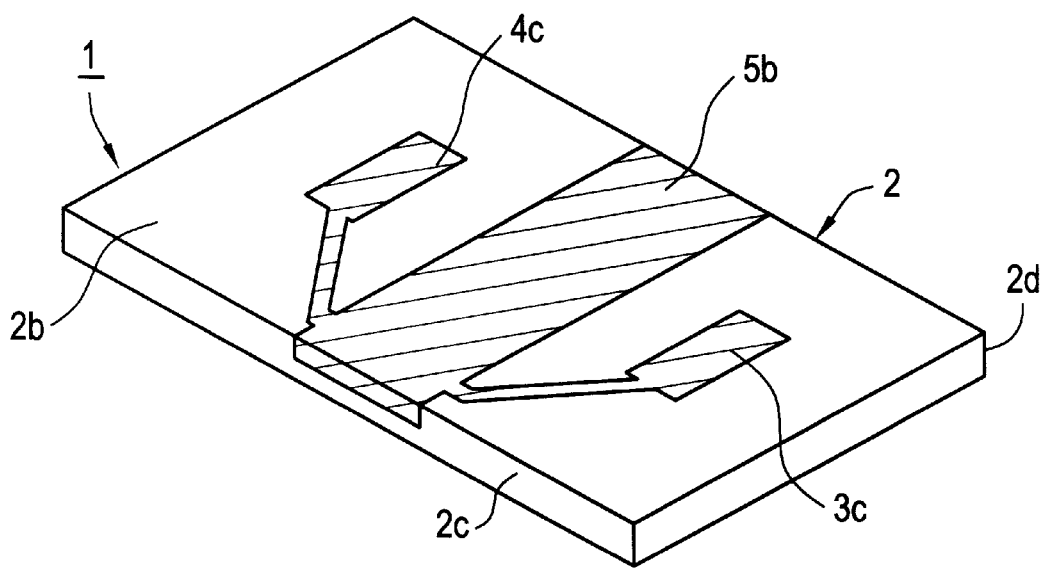

Referring to FIGS. 1(a) and 1(b), a piezoelectric filter 1 includes a substantially rectangular piezoelectric substrate 2. The piezoelectric substrate 2 can be constituted by using piezoelectric ceramics such as, for example, a lead titanate zirconate group piezoelectric ceramic or a piezoelectric single crystal formed of quartz or the like, or other suitable material. When the piezoelectric substrate 2 is made of piezoelectric ceramics, the piezoelectric substrate 2 is preferably polarized in the thickness direction.

A first resonating unit 3 and a second resonating unit 4 and a coupling capacitance unit 5 are provided on a piezoelectric substrate 2. The first resonating unit 3 is provided with a pair of (a first and a second) resonance electrodes 3a and 3b provided on a first major surface (an upper surface) 2a of the piezoelectric substrate 2. The resonance electrodes 3a and 3b are opposed to each other with a gap being provided therebetween. A common electrode 3c is provided on a second major surface (a lower surface) 2b of the piezoelectric substrate 2 to oppose the resonance electrodes 3a and 3b such that the piezoelectric substrate 2 is located therebetween. With respect to the second resonating unit 4, resonance electrodes 4a and 4b are provided on the upper surface 2a of the piezoelectric substrate 2 and a common electrode 4c is disposed on the lower surface 2b thereof.

The coupling capacitance unit 5 is provided with a coupling capacitance electrode 5a located on the upper surface 2a of the piezoelectric substrate 2 and a coupling capacitance electrode 5b located on the lower surface 2b. According to this preferred embodiment, the coupling capacitance electrode 5b is arranged to extend to a pair of side edge surfaces 2c and 2d of the piezoelectric substrate 2.

Further, the coupling capacitance electrode 5a is arranged to extend to both end edges of the upper surface 2a of the piezoelectric substrate 2. Further, portions of the coupling capacitance electrode 5b extending to the side edge surfaces 2c and 2d of the piezoelectric substrate 2 are arranged such that these portions of the coupling capacitance electrode 5b do not extend to end edges located between the upper surface 2a of the piezoelectric substrate 2 and the side edge surfaces 2c and 2d. That is, the portions of the coupling capacitance electrode 5b extending to the side edge surfaces 2c and 2d are arranged such that these portions do not reach the end edges located between the upper surface 2a and the side edge surfaces 2c and 2d of the piezoelectric substrate 2 to prevent a short-circuit from occurring.

The resonance electrode 3a is electrically connected to an input electrode 6a located at a corner portion of the upper surface 2a of the piezoelectric substrate 2. The resonance electrode 3b is electrically connected to the coupling capacitance electrode 5a. The resonance electrode 4a of the second resonating unit 4 is also electrically connected to the coupling capacitance electrode 5a. The resonance electrode 4b is electrically connected to an output electrode 6b disposed at a vicinity of a corner portion on the upper surface 2a of the piezoelectric substrate 2.

On the lower surface 2b of the piezoelectric substrate 2, the common electrodes 3c and 4c are electrically connected to the coupling capacitance electrode 5b via conductive patterns.

Figure 2:
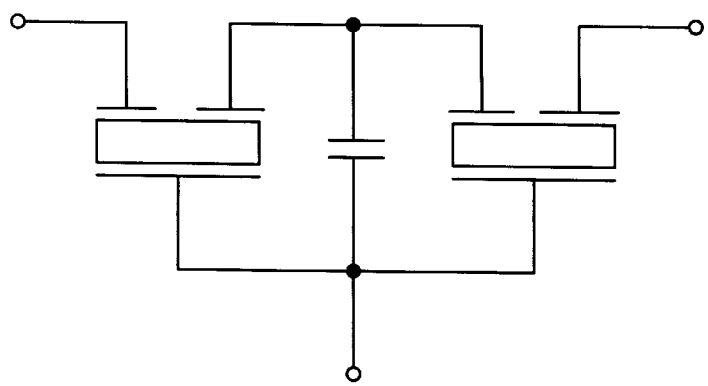
FIG. 2 is a diagram showing a circuit arrangement of the piezoelectric filter according to the preferred embodiment of FIG. 1.

Therefore, a piezoelectric filter circuit which vibrates in a thickness extensional vibration mode shown by FIG. 2 is provided between the input electrode 6a and the output electrode 6b, and the coupling capacitance electrode 5b.

One feature of the piezoelectric filter 1 according to preferred embodiments of the present invention resides in that at least one of the coupling capacitance electrodes 5a and 5b or the coupling capacitance electrode 5b is arranged to extend to and reach the side edge surfaces 2c and 2d of the piezoelectric substrate 2 to thereby significantly increase the coupling capacitance compared to that of the conventional piezoelectric filter 51. More specifically, the coupling capacitance electrode 5b extends to the side edge surfaces 2c and 2d and accordingly, an electrostatic capacitance is obtained between the portions of the coupling capacitance electrode disposed on the side edge surfaces and the coupling capacitance electrode 5a by which the coupling capacitance is increased. Therefore, the coupling capacitance in the preferred embodiments of the present invention is significantly increased without increasing the areas of the upper surface 2a and the lower surface 2b of the piezoelectric substrate 2. Accordingly, the piezoelectric filter 1 can have a greatly reduced size.

An explanation will be given of a change in capacitance which is made possible because of the provision of the portions of the coupling capacitance electrode 5b extending to the side edge surfaces 2c and 2d based on specific experimental examples.

Figure 4:
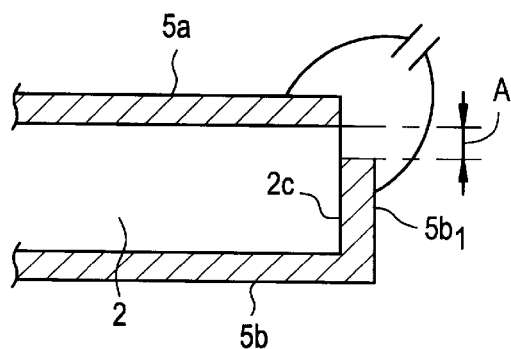
FIG. 4 is a schematic partially cut sectional view for explaining a distance A between the upper end of the coupling capacitance electrode and the upper surface of the piezoelectric substrate.
Figure 3:
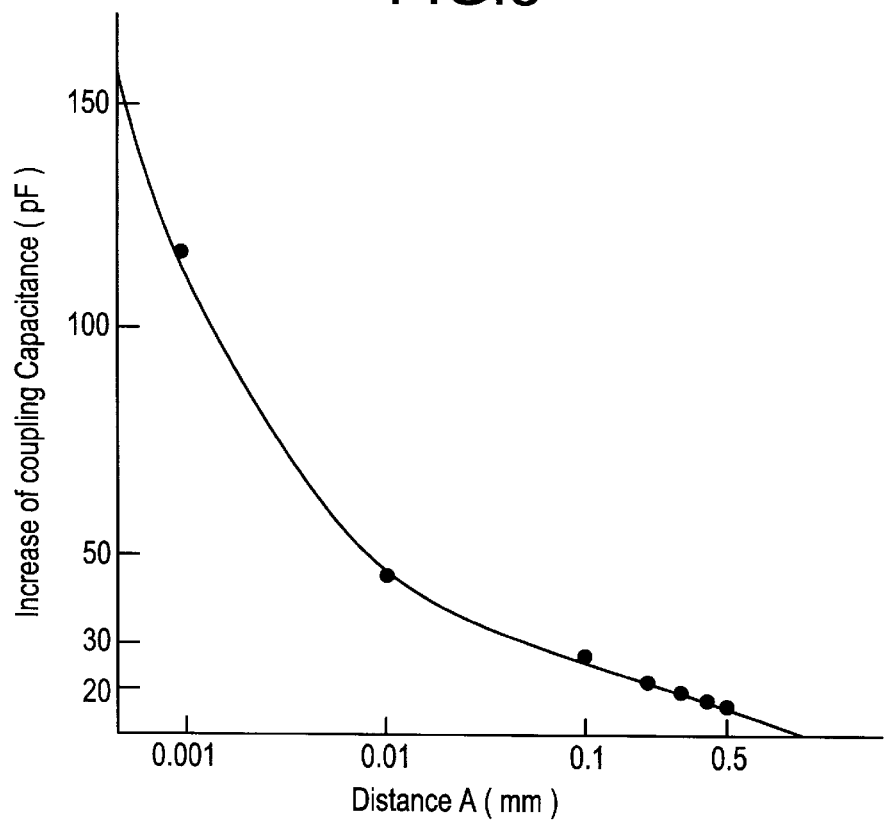
FIG. 3 is a diagram showing a relationship between an electrostatic capacitance obtained by a portion of a coupling capacitance electrode extending to a side edge surface of a piezoelectric substrate and another coupling capacitance electrode and a distance between an upper end of the portion of the coupling capacitance electrode extending to the side edge surface of the piezoelectric substrate and an upper surface of the piezoelectric substrate.

In one example of a preferred embodiment of the present invention, a piezoelectric substrate 2 made of a lead titanate zirconate group of piezoelectric ceramics has a dielectric constant of about 1200 and has a thickness of about 0.6 mm, and includes an electrode having a width of about 1.2 mm and a length of about 3.5 mm which is arranged as the coupling capacitance electrode 5a. The shape of the coupling capacitance electrode 5b on the lower surface of the piezoelectric substrate 2 was made the same as that of the coupling capacitance electrode 5a and an increase in coupling capacitance when dimensions of the portions of the coupling capacitance electrode 5b on the side edge surfaces of 2c and 2d were changed, was measured. The result of such measurement is shown in FIG. 3. Incidentally, the increase of coupling capacitance was a value of a coupling capacitance obtained when the coupling capacitance electrode 5b was arranged to reach the side edge surfaces 2c and 2d subtracted by a coupling capacitance when the coupling capacitance electrode 5b was formed such that the coupling capacitance electrode 5b did not reach the side edge surfaces 2c and 2d. Further, the abscissa of FIG. 3 signifies a distance A between an upper end of a portion $5b_1$ of the coupling capacitance electrode 5b extending to the side edge surface 2c and the upper surface 2a of the piezoelectric substrate 2 as shown by FIG. 4. As is apparent from FIG. 3, the smaller the distance A between the upper end of the portion $5b_1$ of the coupling capacitance electrode 5b extending to the side edge surface 2c or 2d and the upper surface of the piezoelectric substrate 2, the larger the increase in coupling capacitance and the larger the length of the portion 5b. That is, the smaller the length of the portion of the coupling capacitance electrode 5b at the side edge surface 2c or 2d, the smaller the capacitance added by the portion of the coupling capacitance electrode on the side edge surface.

According to this kind of piezoelectric filter, the electrostatic capacitance of a coupling capacitance is normally about 50 to about 200 pF. As is apparent from FIG. 3, it is known that an electrostatic capacitance having a sufficient magnitude can be added by arranging the coupling capacitance electrode 5b so that it extends to the side edge surfaces 2c and 2d. Accordingly, compared with the conventional piezoelectric filter 51, even in the case of reduction of the areas of the portions of the coupling capacitance electrodes 5a and 5b which are opposed to each other with the piezoelectric substrate 2 located therebetween, a desired coupling capacitance can easily be provided by arranging the coupling capacitance electrode 5b to extend to and reach the side edge surfaces 2c and 2d to thereby significantly increase an electrostatic capacitance.

According to a piezoelectric filter 1 of preferred embodiments of the present invention, the coupling capacitance electrode 5b connected to the ground potential is arranged to extend to and reach the side edge surfaces 2c and 2b. Alternatively, the coupling capacitance electrode 5a on the hot side or input side of the filter may be arranged to reach the side edge surfaces 2c and 2d.

Further, although the coupling capacitance electrode 5b is arranged to reach both side edge surfaces 2c and 2d in a preferred embodiment described above, the coupling capacitance electrode may be extended to only one of the two side edge surfaces 2c and 2d.

Further, both of the coupling capacitance electrodes 5a and 5b may be arranged so as to reach both of the side edge surfaces 2c and 2d of the piezoelectric substrate 2.

Figure 5:
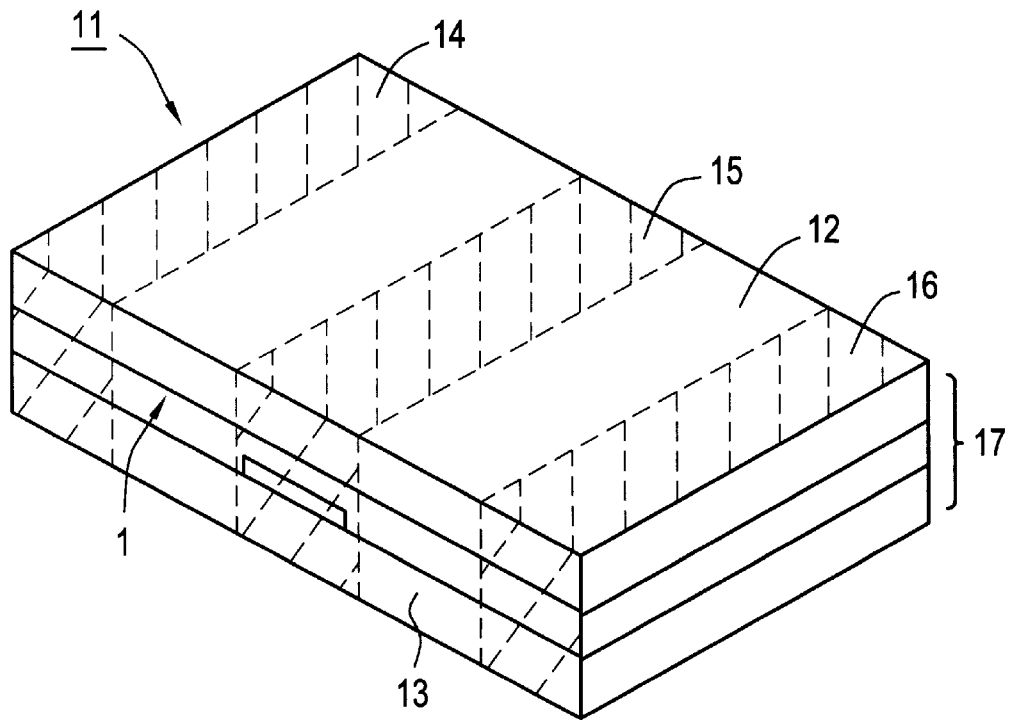
FIG. 5 is a perspective view showing a chip type piezoelectric filter component incorporating the preferred embodiment of the piezoelectric filter shown in FIG. 1.
Figure 7:
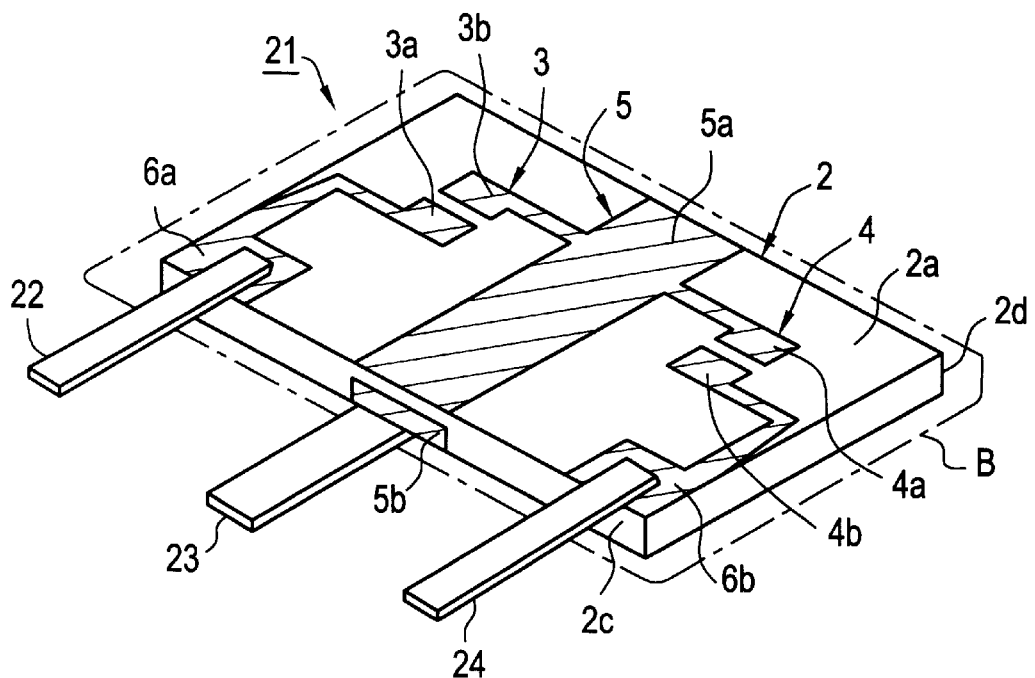
FIG. 7 is a perspective view showing a piezoelectric filter component including lead terminals constituted by using the piezoelectric filter according to the preferred embodiment shown by FIG. 1.
Figure 8:
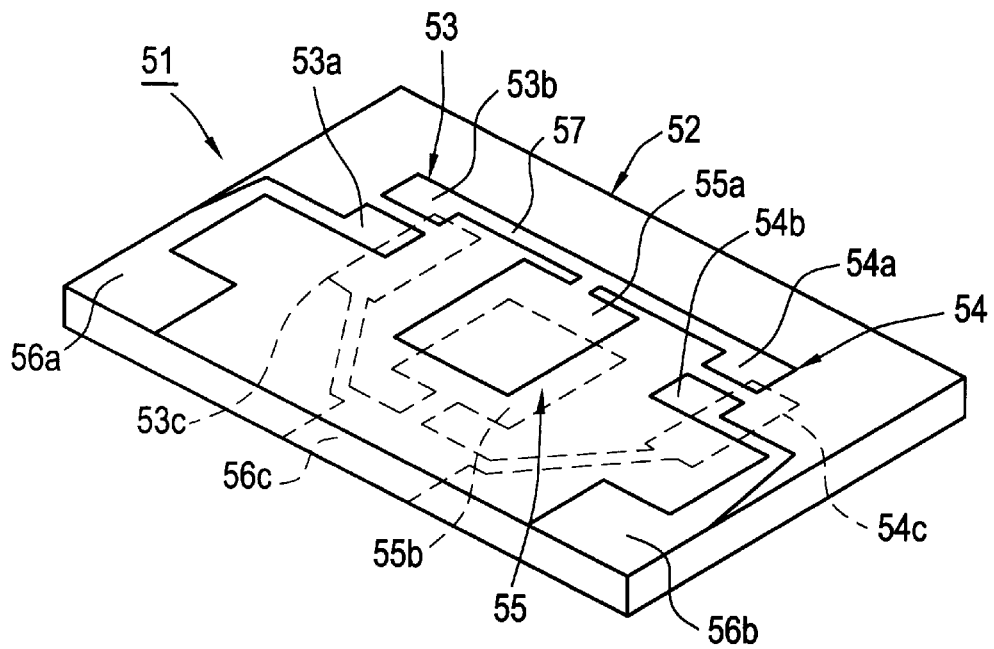
FIG. 8 is a perspective view showing an example of a conventional piezoelectric filter.
Figure 9:
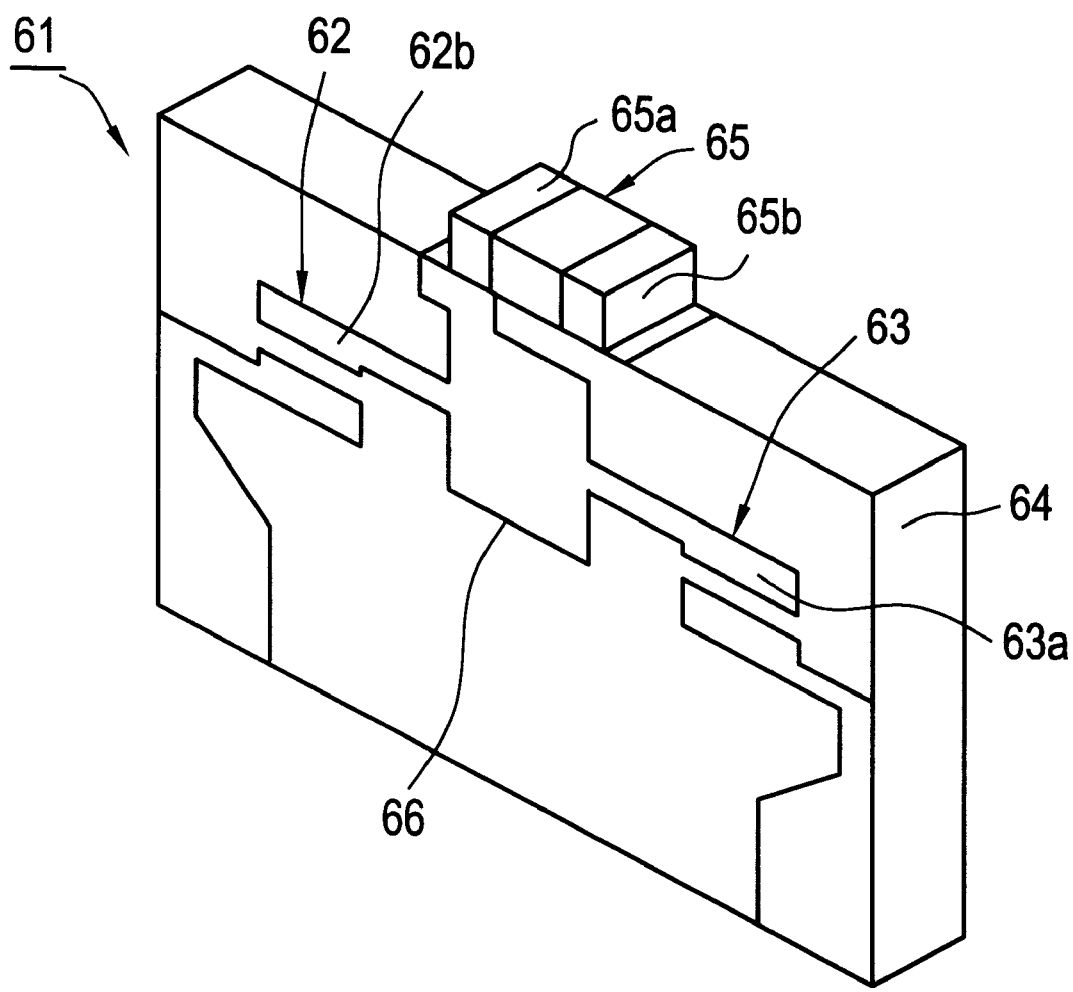
FIG. 9 is a perspective view showing other example of a conventional piezoelectric filter.

Although the piezoelectric filter 1 is featured in that the coupling capacitance electrode is arranged to reach the side edge surfaces of the piezoelectric substrate, in manufacturing a product, a chip type piezoelectric filter component shown by FIG. 5 may be provided or a piezoelectric filter component having lead terminals externally mounted with resin as shown in FIG. 7 may be provided.

That is, a chip type piezoelectric filter component 11 shown in FIG. 5 is constituted by laminating seal substrates 12 and 13 on the upper surface and the lower surface of the above-described piezoelectric filter 1 and forming external electrodes 14–16. The seal substrates 12 and 13 may preferably comprise insulating ceramics such as alumina or the like or an insulating material such as synthetic resin or the like.

Figure 6:
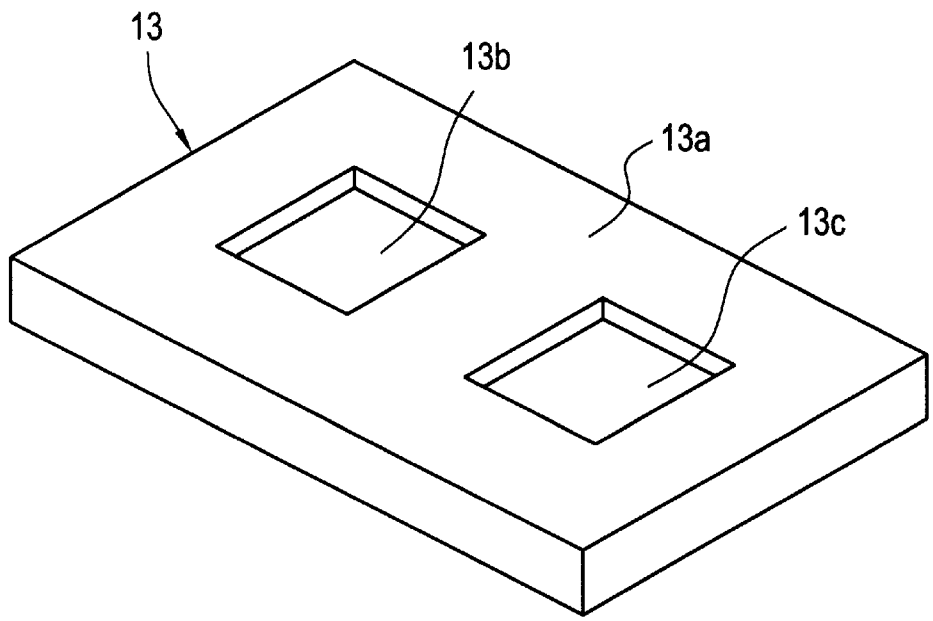
FIG. 6 is a perspective view for explaining a seal substrate used in the chip type piezoelectric filter component shown in FIG. 5.

As shown by FIG. 6 illustrating a perspective view, the seal substrate 13 is provided with recess portions 13b and 13c on an upper surface 13a. The recess portions 13b and 13c are provided to secure spaces for preventing the vibration of the first and the second resonating units from being hindered. Although not particularly illustrated, recess portions are preferably similarly provided also on the lower surface of the seal substrate 12.

The seal substrates 12 and 13 are adhered to the upper surface and the lower surface of the piezoelectric filter 1 preferably via an adhesive agent (not shown) or other suitable member. Further, spaces for preventing the vibration of the resonating units from being disturbed or hindered may be defined by a thickness of an adhesive agent by coating the adhesive agent at locations except regions corresponding to positions of recess portions and curing the adhesive agent without forming the above-described recess portions 13b and 13c. Alternatively, members having a flat plate shape may be used as the seal substrates 12 and 13 and a spacer having openings for preventing the vibration of the resonating units from being disturbed may be interposed between the piezoelectric filter 1 and the seal substrates.

The external electrodes 14–16 may respectively be formed by a process of coating, curing, vapor-depositing, plating, sputtering or the like, of a conductive paste. The external electrodes 14–16 are respectively arranged to extend around the outer periphery of a laminated body 17 in which the seal substrates 12 and 13 are laminated on the upper surface and the lower surface of the piezoelectric filter 1. The external electrode 14 is connected electrically to the input electrode 6a (see FIG. 1) of the piezoelectric filter 1, the external electrode 15 is connected electrically to the coupling capacitance electrode 5b and the external electrode 16 is connected electrically to the output electrode 6b (see FIG. 1).

Accordingly, the chip type piezoelectric filter part 11 can easily be surface-mounted on a printed circuit board or the like by utilizing the external electrodes 14–16.

Further, according to a piezoelectric filter component 21 having lead terminals externally mounted with resin as shown by FIG. 7, lead terminals 22, 24 and 23 are respectively bonded to the input electrode 6a, the output electrode 6b and the coupling capacitance electrode 5b of the piezoelectric filter 1 by using a conductive bonding material such as solder or the like. Further, the total surface thereof is covered with the externally mounted resin as shown by single-dot chain lines B except portions for extending the lead terminals 22–24. In this case, spaces for preventing the vibration of the resonating units from being disturbed or hindered are formed between the externally mounted resin and the resonating units. In forming the spaces, when the externally mounted resin is coated and blown, wax or another suitable material, which is capable of being spread as a result of heating and curing the externally mounted resin, may be provided previously at a periphery of the resonating units.

Although according to the piezoelectric filter 1, the first and the second resonating units 3 and 4 are provided and a single coupling capacitance unit 5 is provided between the first and the second resonating units, the piezoelectric filter according to preferred embodiments of the present invention is not limited to the structure shown by FIG. 1. That is, three or more of the resonating units may be provided and further, a plurality of the coupling capacitance units may be provided in accordance with the number of the resonating units.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric filter, comprising:

a piezoelectric substrate having a first major surface and a second major surface opposed to each other and at least one side edge surface located between the first and the second major surfaces;

a plurality of resonating units each of which includes a pair of resonance electrodes provided on the first major surface of the piezoelectric substrate with a gap between the pair of resonance electrodes and a common electrode provided on the second major surface and opposed to the pair of resonance electrodes such that the piezoelectric substrate is located therebetween; and a coupling capacitance unit including a pair of coupling capacitance electrodes each provided on a respective one of the first and the second major surfaces of the piezoelectric substrate and opposed to each other such that the piezoelectric substrate is located therebetween; wherein at least one of the coupling capacitance electrodes extends to the at least one side edge surface of the piezoelectric substrate; and one of the pair of coupling capacitance electrodes on the first major surface extends to at least one side edge of the piezoelectric substrate and the other of the pair of coupling capacitance electrodes on the second major surface extends on to at least one side edge surface of the piezoelectric substrate.

2. The piezoelectric filter according to claim 1, wherein each of the coupling capacitance electrodes extends to the at least one side edge surface of the piezoelectric substrate.

3. The piezoelectric filter according to claim 1, wherein the at least one side edge surface is a first side edge surface and the piezoelectric substrate further includes a second side edge surface located between the first and the second major surfaces and the at least one of the coupling capacitance electrodes extends to each of the first and second side edge surfaces.

4. The piezoelectric filter according to claim 1, wherein the piezoelectric substrate further includes a second side edge surface located between the first and the second major surfaces and each of the coupling capacitance electrodes extends to each of the first and second side edge surfaces.

5. The piezoelectric filter according to claim 1, wherein the resonating units are arranged to vibrate in a thickness extensional vibration mode.

6. The piezoelectric filter according to claim 1, wherein the coupling capacitance electrode extending to the at least one side edge surface of the piezoelectric substrate is connected to a ground potential.

7. A chip type piezoelectric filter, comprising:
a piezoelectric substrate having a first major surface and a second major surface opposed to each other and at least one side edge surface between the first and the second major surfaces;
a plurality of resonating units each of which includes a pair of resonance electrodes provided on the first major surface of the piezoelectric substrate with a gap between the pair of resonance electrodes and a common electrode provided on the second major surface and opposed to the pair of resonance electrodes such that the piezoelectric substrate is located therebetween; and
a coupling capacitance unit including a pair of coupling capacitance electrodes each provided on a respective one of the first and the second major surfaces of the piezoelectric substrate and opposed to each other such that the piezoelectric substrate is located therebetween; wherein
at least one of the coupling capacitance electrodes extends to the side edge surface of the piezoelectric substrate;
a pair of seal substrates provided on the first and the second major surfaces of the piezoelectric filter, respectively; and
a space provided between the piezoelectric substrate and the pair of seal substrates for preventing a vibration of the resonating unit from being hindered; wherein
one of the pair of coupling capacitance electrodes on the first major surface extends to at least one side edge of the piezoelectric substrate and the other of the pair of coupling capacitance electrodes on the second major surface extends on to at least one side edge surface of the piezoelectric substrate.

8. The chip type piezoelectric filter according to claim 7, wherein each of the coupling capacitance electrodes extends to the at least one side edge surface of the piezoelectric substrate.

9. The chip type piezoelectric filter according to claim 7, wherein the at least one side edge surface is a first side edge surface and the piezoelectric substrate further includes a second side edge surface located between the first and the second major surfaces and the at least one of the coupling capacitance electrodes extends to each of the first and second side edge surfaces.

10. The chip type piezoelectric filter according to claim 7, wherein the piezoelectric substrate further includes a second side edge surface located between the first and the second major surfaces and each of the coupling capacitance electrodes extends to each of the first and second side edge surfaces.

11. The chip type piezoelectric filter according to claim 7, wherein the resonating units are arranged to vibrate in a thickness extensional vibration mode.

12. The chip type piezoelectric filter according to claim 7, wherein the coupling capacitance electrode extending to the at least one side edge surface of the piezoelectric substrate is connected to a ground potential.

13. A piezoelectric filter component, comprising:
a piezoelectric substrate having a first major surface and a second major surface opposed to each other and at least one side edge surface located between the first and the second major surfaces of the piezoelectric substrate;
a plurality of resonating units each of which includes a pair of resonance electrodes provided on the first major surface of the piezoelectric substrate with a gap between the pair of resonance electrodes and a common electrode provided on the second major surface and opposed to the pair of resonance electrodes such that the piezoelectric substrate is located therebetween; and
a coupling capacitance unit including a pair of coupling capacitance electrodes each provided on a respective one of the first and the second major surfaces of the piezoelectric substrate and opposed to each other such that the piezoelectric substrate is located therebetween; wherein
at least one of the coupling capacitance electrodes extends to the at least one side edge surface of the piezoelectric substrate;
a resin covering the piezoelectric filter; and
a plurality of lead terminals electrically connected to the pair of resonance electrodes and the pair of coupling capacitance electrodes, respectively and extending outward from the resin; wherein
one of the pair of coupling capacitance electrodes on the first major surface extends to at least one side edge of the piezoelectric substrate and the other of the pair of coupling capacitance electrodes on the second major surface extends on to at least one side edge surface of the piezoelectric substrate.

14. The piezoelectric filter component according to claim 13, wherein each of the coupling capacitance electrodes extends to the at least one side edge surface of the piezoelectric substrate.

15. The piezoelectric filter component according to claim 13, wherein the at least one side edge surface is a first side edge surface and the piezoelectric substrate further includes a second side edge surface located between the first and the second major surfaces and the at least one of the coupling capacitance electrodes extends to each of the first and second side edge surfaces.

16. The piezoelectric filter component according to claim 13, wherein the piezoelectric substrate further includes a second side edge surface located between the first and the second major surfaces and each of the coupling capacitance electrodes extends to each of the first and second side edge surfaces.

17. The piezoelectric filter component according to claim 13, wherein the resonating units are arranged to vibrate in a thickness extensional vibration mode.

18. The piezoelectric filter component according to claim 13, wherein the coupling capacitance electrode extending to the at least one side edge surface of the piezoelectric substrate is connected to a ground potential.

* * * * *